United States Patent
Yu

(10) Patent No.: US 7,019,363 B1
(45) Date of Patent: Mar. 28, 2006

(54) MOS TRANSISTOR WITH ASYMMETRICAL SOURCE/DRAIN EXTENSIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/476,961

(22) Filed: Jan. 3, 2000

(51) Int. Cl.
*H01L 29/76* (2006.01)
*H01L 29/94* (2006.01)

(52) U.S. Cl. ............ 257/344; 257/339; 257/356; 257/376

(58) Field of Classification Search ........ 257/288, 257/344, 339, 356, 372, 376
See application file for complete search history.

(56) References Cited

U.S. PATENT DOCUMENTS

| | | | |
|---|---|---|---|
| 4,683,645 A | 8/1987 | Naguib et al. | |
| 5,393,685 A | 2/1995 | Yoo et al. | |
| 5,593,907 A | 1/1997 | Anjum et al. | |
| 5,607,884 A | 3/1997 | Byun | |
| 5,625,216 A * | 4/1997 | Miller | 257/387 |
| 5,677,224 A * | 10/1997 | Kadosh et al. | 438/197 |
| 5,793,090 A | 8/1998 | Gardner et al. | |
| 5,811,323 A | 9/1998 | Miyasaka et al. | |
| 5,825,066 A | 10/1998 | Buynoski | |
| 5,831,306 A * | 11/1998 | Gardner et al. | 257/344 |
| 5,935,867 A * | 8/1999 | Alvis et al. | 437/35 |
| 6,218,276 B1 * | 4/2001 | Liu et al. | 438/596 |

* cited by examiner

*Primary Examiner*—Tom Thomas
*Assistant Examiner*—Matthew E. Warren
(74) *Attorney, Agent, or Firm*—Foley & Lardner LLP

(57) ABSTRACT

A method of fabricating an integrated circuit utilizes symmetric source/drain junctions. The process can be utilized for P-channel or N-channel metal oxide field semiconductor effect transistors (MOSFETS). The drain extension is deeper than the source extension. The source extension is more conductive than the drain extension. The transistor has reduced short channel effects and strong drive current and yet is reliable.

2 Claims, 1 Drawing Sheet

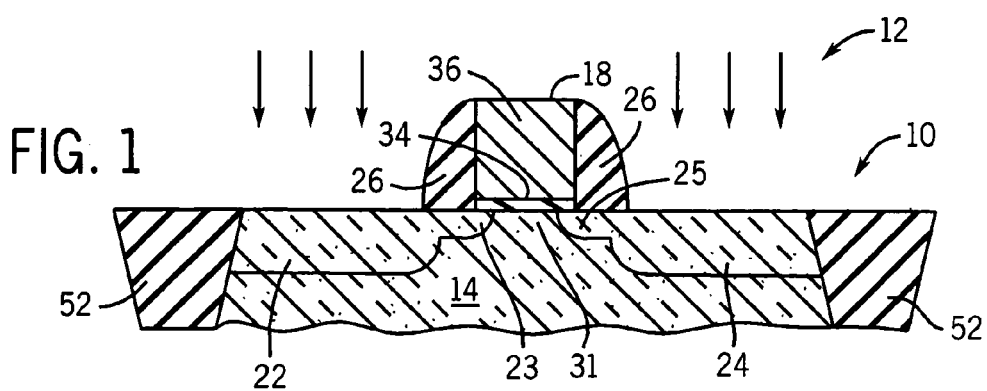
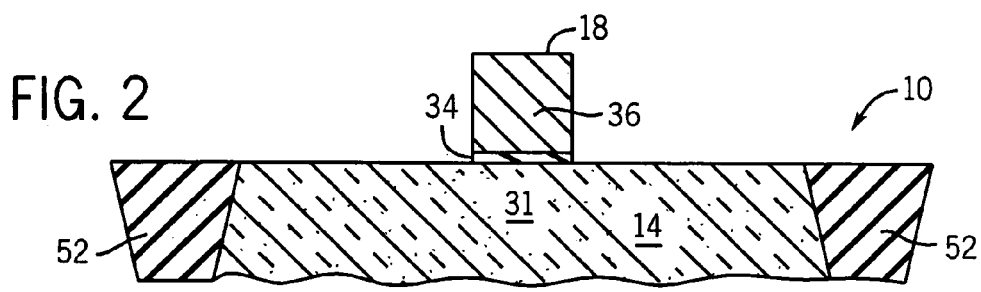
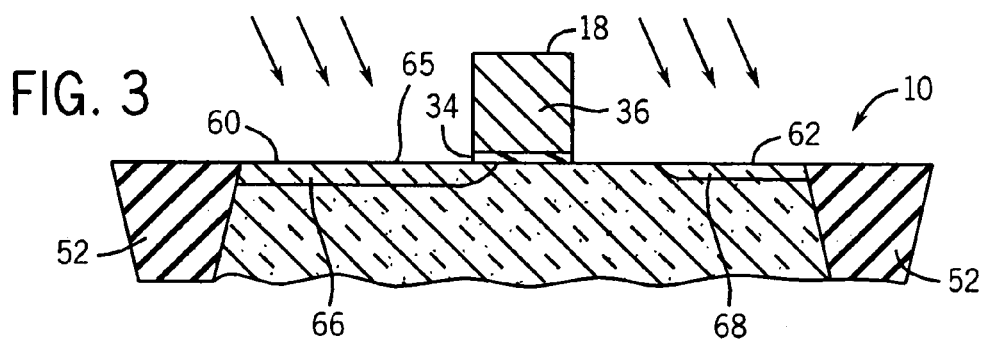
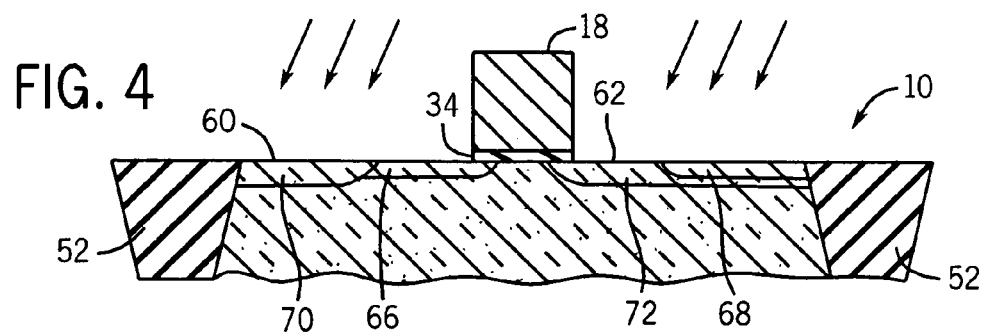

MOS TRANSISTOR WITH ASYMMETRICAL SOURCE/DRAIN EXTENSIONS

CROSS REFERENCE TO RELATED APPLICATIONS

This patent application is related to U.S. application Ser. No. 09/187,630, filed on Nov. 6, 1998 by Yu, titled "Dual Amorphization Implant Process for Ultra-Shallow Drain and Source Extensions" and U.S. application Ser. No. 09/476,527 by Yu, on an even date herewith titled "MOS Transistor with Local Channel Compensation Implant." Both applications are assigned to the assignee of the present invention.

FIELD OF THE INVENTION

The present invention relates to integrated circuits and methods of manufacturing integrated circuits. More particularly, the present invention relates to a transistor and a method of manufacturing it. The transistor includes asymmetrical source/drain extensions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

Conventional techniques utilize a double implant process to form shallow symmetrical source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process vertically introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is vertically doped a second time to form the deeper source and drain regions. The source and drain extensions are not further doped due to the blocking capability of the silicon dioxide spacer.

As transistors disposed on integrated circuits (ICs) become smaller, and critical dimensions of MOSFETS are reduced, proper design and engineering of source/drain extensions becomes more critical to the operation of small-scale transistors. In conventional MOSFET structures, the source extension and the drain extension are formed in the same fabrication process step. For example, as stated above, the source extension and drain extension can be formed in the same ion implantation step or the same impurity thermal defusion step. Accordingly, the source extension and the drain extension generally have identical characteristics. For example, the source extension and the drain extension can have an identical dopant profile, dopant concentration, junction concentration, and junction depth.

Generally, a shallow source extension provides better immunity to short channel effects, such as, threshold voltage-roll off and drain induced barrier lowering. The parasitic series resistance of the source extension also plays an important role in transistor drive current. The larger the source extension resistance, the smaller the gate-to-source bias (Vgs), and hence the smaller the transistor drive current. Accordingly, the source extension should be as conductive as practicable. In contrast, the drain extension may not be as important as the source extension in terms of control of short channel effects and drive current. However, it does play an important role in transistor reliability.

Thus, there is a need for a transistor with optimized source and drain extensions. Further, there is a need for a method of manufacturing a transistor that has asymmetrical source and drain extensions. Further still, there is a need for transistors that have immunity to short channel effects and low drive current and yet have suitable reliability. Even further still, there is a need for a transistor having a deeper, more lightly doped drain extension than the source extension and a method of manufacturing such a transistor.

SUMMARY OF THE INVENTION

An exemplary embodiment relates to a method of manufacturing an integrated circuit. The method includes: providing a gate structure, providing an angled source extension implant, providing an angled drain extension implant, and providing a deep source/drain implant. The gate structure is located between a source location and a drain location in a semiconductor substrate. The source extension implant is provided in a direction from the source location to the drain location. The drain extension implant is provided in a direction from the drain location to the source location. The deep source/drain implant is provided at the source location and the drain location.

Another exemplary embodiment relates to a method of manufacturing an ultra-light scale integrated circuit including a plurality of field effect transistors. The method includes steps of: providing at least part of a gate structure, forming a source extension with dopants of a first conductivity type, forming a drain extension with dopants of the first conductivity type, and forming deep source and drain regions with dopants of the first conductivity type. The gate structure is provided at a top surface of the semiconductor substrate. The gate structure is located between the source and drain regions. The drain extension is deeper than the source extension.

Another exemplary embodiment relates to an integrated circuit including a plurality of field effect transistors. Each of the transistors includes a gate structure disposed over a channel, a deep source region, a deep drain region, a source extension, and a drain extension. The deep source region and deep drain region are heavily doped with dopants of a first conductivity type. The source extension is the deep source region. The drain extension is integral to the deep region. The drain extension is deeper than the source extension.

BRIEF DESCRIPTION OF THE DRAWINGS

Exemplary embodiments will hereafter be described with reference to the accompanying drawings wherein like numerals denote like elements, and:

FIG. 1 is a cross-sectional view of a portion of an integrated circuit having a transistor with optimized source and drain extensions in accordance with an exemplary embodiment;

FIG. 2 is a cross-sectional view of the portion of the integrated circuit illustrated in FIG. 1, showing a gate structure formation step;

FIG. 3 is a cross-sectional view of the portion of the integrated circuit illustrated in FIG. 1, showing a tilt angle source extension implant step; and FIG. 4 is a cross-sectional view of the portion of the integrated circuit illustrated in FIG. 1, showing a tilt angle drain extension implant step.

DETAILED DESCRIPTION OF THE PREFERRED EXEMPLARY EMBODIMENTS

With reference to FIG. 1, a transistor 12 is disposed on a semiconductor substrate 14, such as, a single crystal silicon wafer. Transistor 12 is part of a portion 10 of an integrated circuit (IC) manufactured on a wafer (such as, a silicon wafer). Transistor 12 can be an N-channel or a P-channel field effect transistor, such as, a metal oxide semiconductor field effect transistor (MOSFET). Transistor 12 is described below as an N-channel transistor.

Transistor 12 includes a gate structure 18, a deep source region 22, and a deep drain region 24. Regions 22 and 24 have a concentration of $10^{19}$ to $10^{20}$ dopants per cubic centimeter (heavily doped, P+ or N+). Transistor 12 also includes a source extension 23 and a drain extension 25. Transistor 12 is positioned between insulative structures 52.

Gate structure 18 includes a gate oxide 34 and a gate conductor 36. Gate structure can also include a pair of insulative spacers 26. Gate structure 18 is above a channel 31 of substrate 14. Channel 31 is doped to a concentration of $1-5\times10^7$ P-type dopants per centimeter cubed for an N-channel transistor. Channel 31 can be appropriately configured with profile characteristics including pocket regions. Structure 18 is preferably 50 nm–250 nm wide and 1000–2000 Å thick (depth).

Spacers 26 can be a silicon nitride ($Si_3N_4$) or silicon dioxide ($SiO_2$) material. Gate oxide 34 is preferably thermally grown on substrate 14. Conductor 36 is preferably a metal conductor or polysilicon deposited by chemical vapor deposition (CVD) and etched to form the particular structure for transistor 12. Spacers 26 are preferably formed by depositing a layer, planarizing and etching the deposited layer to leave spacers 26. Spacers 26 are 500–800 Å wide and 1000–2000 Å thick.

Source extension 23 is preferably an ultra-shallow extension (e.g., junction depth is less than 40 nanometers (nm) (e.g., 20–40 nm)), which is thinner than regions 22 and 24 and drain extension 25. Source extension 23 is integral or connected with source region 22 and is disposed partially underneath gate oxide 34. Extension 23 can be 40–60 nm wide. Ultra-shallow source extension 23 helps transistor 12 achieve substantial immunity to short-channel effects. Short-channel effects can degrade performance of transistor 12 as well as the manufacturability of the IC associated with transistor 12. Source extension 23 has a concentration of $5\times10^{19}-1\times10^{20}$ (preferably $1\times10^{20}$) dopants per cubic centimeter. In addition, the conductivity of source extension 23 reduces parasitic series resistance. Decreased parasitic series resistance reduces the gate-to-source bias (Vgs) and hence increases drive current.

Drain extension 25 is preferably an extension which is thinner than regions 22 and 24 and thicker than source extension 23. Extension 25 is 40–60 nm wide and 80–120 nm junction depth (thickness). Extension 25 is integral or connected with drain region 24 and is disposed partially underneath gate oxide 34. Drain extension 25 may not be as important as source extension 23 in terms of control of short channel effects and drive current. However, the dosage of the implant associated with drain extension 25 can play an important role in transistor reliability. For a longer lifetime of transistor 12 under hot-carrier injection stress, a relatively deep and lightly doped drain extension 25 reduces the peak electric field in channel 34 and hence, reduces the possibility of hot-carrier injection into gate oxide 34. Thus, transistor 12 with its asymmetric source extension 23 and drain extension 25 has an advantageous transistor performance. Drain extension 25 has a concentration of $1\times10^{19}-5\times10^{19}$ dopants per cubic centimeter.

Transistor 12 can be at least partially covered by an insulative layer and is preferably part of an ultra-large scale integrated (ULSI) circuit that includes one million or more transistors. Conductive vias can be provided through the insulative layer to connect to regions 22 and 24.

With reference to FIGS. 1–4, the fabrication of transistor 12, including source extension 23 and drain extension 25 is described below as follows. The advantageous process allows a transistor 12 with asymmetric extensions 23 and 25 to be formed. Extensions 23 and 25 can vary from each other with respect to depth, size, dopant concentration, junction concentration, dopant, etc.

Source extension 23 and drain extension 25 are preferably formed in different ion implantation steps. Preferably, tilted implantation steps in which high energy ions which strike substrate 14 at an angle are utilized. Source extension 23 and drain extension 25 can be implanted at different angles and with different dopants at different energies to form asymmetric extensions 23 and 25. The different angles can satisfy the different requirements for the characteristics of extension 23 and extension 25.

In FIG. 2, transistor 12 can be substantially formed by conventional semiconductor processing techniques to form gate structure 18 including gate oxide 34 and gate conductor 36. Conventional LOCOS or shallow trench isolation processes can be used to form insulative structures 52.

Gate structure 18 is formed on substrate 14 which is doped with $1-5\times10^{17}$ P-type dopants per cubic centimeter, assuming an N-channel transistor. Gate structure 18 can be formed by depositing or growing a dielectric layer on substrate 14 and a metal or polysilicon layer over the dielectric layer and etching to leave conductor 36 and oxide 34 as structure 18 via a lithographic process. Structure 18 is above channel 31 between structures 52.

In FIG. 3, substrate 14 is subjected to a source extension implant (the source extension implant can be angled (e.g., 30–60°) from a top surface 65 of substrate 14) to implant dopants from a source location side 60 to a drain location side 62. Preferably, an N-type dopant, such as arsenic, is accelerated to an energy of 1–5 KeV at a dose of 1015 dopants per centimeter squared to form N-type regions 66 and 68 (for an N-channel transistor). Regions 66 and 68 are 6–8 nm deep (e.g., below surface 65) (20 percent of final depth of extension 23).

Due to the tilt angle associated with the source extension implant, region 66 extends underneath gate structure 18 while region 68 is set apart from gate structure 18. The shadowing effect associated with gate structure 18 protects drain location side 62 from the N-type dopants. Alternatively, for a P-channel transistor, P-type dopants, such as boron, can be accelerated to an energy of 200 eV–1 KeV at a dose of $10^{14}$ dopants per centimeters squared to form region 66.

In FIG. 4, substrate 14 is subjected to a drain extension implant. The drain extension implant can be angled (e.g., 30–60° from top surface 65 of substrate 14) from a drain location side 62 to a source location side 60. Preferably, an N-dopant, such as, phosphorous, is accelerated to an energy of 5–15 KeV at a dose of $10^{14}$ dopants per centimeter squared to form N-type regions 70 and 72 for an N-channel transistor. Regions 70 and 72 are 8–12 nm deep (e.g., below surface 65) (20 percent of the final depth of extension 25).

Due to the tilt angle associated with the drain extension implant, region 72 extends underneath gate structure 18 while region 70 is set apart from gate structure 18. The shadowing effect associated with gate structure 18 protects source location side 60 from N-type dopants. Alternatively, for a P-channel transistor, P-type dopants, such as boron diflouride ($BF_2$) can be accelerated to an energy of 5–10 KeV at a dose of $10^{14}$ dopants per centimeters squared.

In FIG. 4, spacers 26 are formed in a conventional deposition and etch back process. Preferably, spacers 26 are silicon dioxide or silicon nitride spacers. After spacers 26 are formed, a deep source/drain implant is provided at an angle of 90° with respect to top surface 65 of substrate 14.

The deep source/drain implant is provided at an energy level of 15 KeV–40 KeV (N-type using As) and a dosage of $1\times10^{15}$–$4\times10^{25}$ dopants per centimeter squared. Preferably, the deep source/drain implant forms deep source region 22 and drain region 24 having a concentration of $10^{19-21}$ dopants per centimeter cubed. Conductor 36 can also be doped during the deep source/drain implant.

After the deep source drain implant, substrate 14 is subjected to a rapid thermal anneal to activate dopants in regions 22 and 24, and extensions 23 and 25. Conventional CMOS processes can be utilized to form other structures associated with portion 10 including interconnects, metal layers or other structures.

The combination of the source extension implant, drain extension implant, and deep source and drain implant results in the source and drain profile illustrated in FIG. 1. The profile advantageously includes extension 23 which is thinner and more conductive than extension 25.

Source extension 23 is preferably formed by a low energy and a high dose ion implantation technique. The low energy and high dose ion implantation technique makes a shallow and highly conductive junction for extension 23. Shallow source extension 23 provides better control of short-channel effects, while a highly conductive source extension 23 reduces current degradation due to series resistance.

Drain extension 25 is preferably formed by a medium energy and low dose ion implantation technique. The medium and low dose ion implantation technique makes a relatively deeper and lightly doped drain extension 25. A lightly doped drain extension 25 with medium depth provides better reliability under hot-carrier injection stress.

Although arsenic is described as utilized for source extension 23 and phosphorous is described as being utilized for extension 25, other impurities or dopants can be utilized depending upon the design requirements for transistor 12. In addition, different thermal annealing techniques can be utilized for source extension 23 and drain extension 25 depending upon transistor design requirement. Further still, the drain extension implant can be performed before the source extension implant.

It is understood that, while preferred embodiments, examples, materials, and values are given, they are for the purpose of illustration only. The apparatus and method of the invention are not limited to the precise details and conditions disclosed. For example, transistor 12 can be fabricated as a P-channel transistor utilizing the method described in FIGS. 1–4, where N-type dopants are exchanged for P-type dopants and vice versa. Although certain implant characteristics are discussed, other methods could be utilized to dope the various regions. Thus, changes may be made to the details disclosed without departing from the spirit of the invention, which is defined by the following claims.

What is claimed is:

1. An integrated circuit including a plurality of field effect transistors, each of the transistors comprising:
    a gate structure disposed over a channel;
    a deep source region heavily doped with dopants of a first conductivity type;
    a deep drain region heavily doped with dopants of the first conductivity type;
    a source extension integral the deep source region; and
    a drain extension into the deep drain region, wherein the drain extension is deeper than the source extension wherein the source extension is more heavily doped than the drain extension.

2. The integrated circuit of claim of claim 1, wherein the drain extension is more than 80 nm thick and the source extension is less than 40 nm thick.

* * * * *

UNITED STATES PATENT AND TRADEMARK OFFICE
CERTIFICATE OF CORRECTION

PATENT NO. : 7,019,363 B1 Page 1 of 1
APPLICATION NO. : 09/476961
DATED : March 28, 2006
INVENTOR(S) : Bin Yu It is certified that error appears in the above-identified patent and that said Letters Patent is hereby corrected as shown below:

ON THE COVER

For the filing date (21) on the cover page, replace "Jan. 3, 2000" with --Jan. 4, 2000--.

IN THE CLAIMS

Column 6, claim 1, line 42, replace "into" with --integral--.

Signed and Sealed this

First Day of August, 2006

JON W. DUDAS
*Director of the United States Patent and Trademark Office*